(12) United States Patent
Rostron et al.

(10) Patent No.: US 8,866,487 B2
(45) Date of Patent: Oct. 21, 2014

(54) DIRECTIONAL FAULT SECTIONALIZING SYSTEM

(75) Inventors: Joseph R. Rostron, McDonough, GA (US); John H. Brunke, Freeland, WA (US); Bradley John Schafer, Fayetteville, GA (US); Richard Charles Leonhardt, McDonough, GA (US); David Lester Moore, Marietta, GA (US)

(73) Assignee: Southern States, LLC, Hampton, GA (US)

( * ) Notice: Subject to any disclaimer, the term of this patent is extended or adjusted under 35 U.S.C. 154(b) by 475 days.

(21) Appl. No.: 13/229,808

(22) Filed: Sep. 12, 2011

(65) Prior Publication Data
US 2012/0062239 A1 Mar. 15, 2012

Related U.S. Application Data

(60) Provisional application No. 61/381,518, filed on Sep. 10, 2010.

(51) Int. Cl.
| | |
|---|---|
| *G01R 31/00* | (2006.01) |
| *H02H 7/26* | (2006.01) |
| *G01R 31/08* | (2006.01) |
| *H02H 3/32* | (2006.01) |

(52) U.S. Cl.
CPC ............... *H02H 7/26* (2013.01); *G01R 31/086* (2013.01); *H02H 3/32* (2013.01)
USPC .......................................................... 324/522

(58) Field of Classification Search
CPC ..................................................... G01R 31/086
See application file for complete search history.

(56) References Cited

U.S. PATENT DOCUMENTS

| | | | | |
|---|---|---|---|---|
| 5,796,259 | A * | 8/1998 | Dickmander | 324/524 |
| 6,873,508 | B2 * | 3/2005 | Kase et al. | 361/80 |
| 8,531,804 | B2 * | 9/2013 | Weems et al. | 361/42 |
| 2008/0297163 | A1 * | 12/2008 | Wahlroos et al. | 324/522 |
| 2009/0009180 | A1 * | 1/2009 | Varghai et al. | 324/521 |

* cited by examiner

*Primary Examiner* — Jeff Natalini
(74) *Attorney, Agent, or Firm* — Mehrman Law Office; Michael J. Mehrman (57) ABSTRACT

A directional fault sectionalizing system that utilizes one phase voltage measurement and three phase current measurements to determine the directionality of high impedance faults on a three phase electric power circuit. This eliminates the need for two of the three voltage measuring devices at each monitoring station conventionally required to determine fault directionality, which makes it economical to install at a greater number of distribution tap points. The system is particularly useful for commonly used three-way tap points along distribution lines where three phase voltage measurement is not readily available. The system is capable of identifying faults under challenging circumstances, such faults occurring on unbalanced three phase power lines and faults occurring on tapped line segments where the currents are relatively small compared to the currents flowing in the main line segments.

18 Claims, 7 Drawing Sheets

DIRECTIONAL FAULT SECTIONALIZING SYSTEM

REFERENCE TO RELATED APPLICATION

This application claims priority to U.S. Provisional Patent Application Ser. No. 61/381,518 for the invention, "Fault Location Detection on Tapped Transmission Lines," filed Sep. 10, 2010, and U.S. Pat. No. 8,659,862 entitled "Directional Fault Location and Isolation System" filed Sep. 9, 2011, which are incorporated by reference. Commonly owned U.S. Pat. Nos. 7,191,074 and 7,683,798, are also incorporated by reference.

TECHNICAL FIELD

The present invention relates to electric power systems and, more particularly, relates to a directional fault sectionalizing system for a three phase electric power circuit that utilizes a single phase voltage measurement and three phase current measurements to determine the directionality of high impedance faults.

BACKGROUND OF THE INVENTION

Faults in electric power systems occur for a variety of reasons, such as trees falling across power lines, transformer failure, shorts in load circuits, and so forth. Once the line section experiencing the fault has been identified, sectionalizing switches are used to isolate the faulted line segment in order to bring the non-faulted sections back into service. Isolating the fault requires identification of the location of the fault with respect to a number of sectionalizing switches that are used to isolate faulted line sections. For a radial distribution circuit, the direction from the substation toward the load is referred to as the forward direction and the direction back toward the substation is referred to as the reverse direction. For a loop fed transmission or distribution circuit, however, the direction along a power line (forward or reverse) is defined as a matter of convention. Sectionalizing switches or circuit breakers and associated monitoring equipment (e.g., voltage and current measuring devices) are typically located at the substations and at major tap points along the power line where transmission or distribution lines "T" from the main power line to pick up loads. When a fault occurs, one or two sectionalizing switches are typically operated to isolate the faulted line segment so that the non-faulted line segments can remain in service.

At present, fault directionality can only be determined at substations where three phase voltage measurements are available. Directional fault identification is not available at tap points away from the substation due to the unavailability of the three phase voltage measurements and the high cost of obtaining those measurement away from the substations. Tap points are therefore "blind spots" for directional fault identification. As a result, over current and voltage techniques are typically used to detect the existence of faults away from the substations and systematic switch closing is typically used to determine the faulted line sections. This is conventionally accomplished by opening all of the sectionalizing switches on a faulted circuit and then systematically closing the switches until the faulted line section has been identified.

Although identification of the faulted line section could be facilitated by determining the direction of the fault at the location of each sectionalizing switch, this is not presently feasible due to the high cost of directional fault detection equipment. More specifically, the faulted line segment could potentially be identified by determining that the fault is forward from one sectionalizing switch and reverse from the next sectionalizing switch along the line. In addition, a tapped line could potentially be identified as the faulted line segment when the change in the direction of the fault occurs at the tap point (i.e., the fault is toward the tap point from both directions along the power line serving the tap point).

However, determining the directionality of a fault on a three phase power line is conventionally accomplished with a voltage monitor and current monitor for each phase, requiring three voltage monitors and three current monitors at each monitoring station. Current monitors are relatively inexpensive whereas the voltage monitors can be a major expense. Although three phase voltage measurements are typically available in substations, they are not generally available at tap points along the power line. The extent of outages could be reduced, by locating directional fault detection equipment at the major tap points along the power line, not just at the substations. But this is typically not economically feasible due to the high cost of installing three voltage monitors at each tap point.

There is, therefore, a continuing need for improved and more cost effective electric power fault isolation systems. There is, in particular, a need for a directional sectionalizing system for a three phase power line that does not require three voltage measurements to determine the directionality of a high impedance fault.

SUMMARY OF THE INVENTION

The present invention meets the needs described above in a directional fault sectionalizing system for a three phase electric power circuit that utilizes one phase voltage measurement and three simultaneous phase current measurements to determine the directionality of high impedance faults. This produces the major advantage of eliminating the need for two of the three voltage measuring devices at each monitoring station conventionally required to determine fault directionality. As a result, the directional fault sectionalizing system is significantly less expensive, which makes it economical to install at a greater number of transmission and distribution tap points. This increases the precision of fault isolation resulting in fewer line segments, and fewer customers, experiencing outages when faults occur.

The directional fault sectionalizing system may be employed for any sectionalizing switch operatively connected to a three phase electric power line segment. A voltage measuring device produces a measurement of a single phase voltage for the line segment and a current measuring device produces three simultaneous phase current measurements for the line segment. A directional fault controller determines directionality of a high impedance fault occurring on one phase of the line segment based on the single phase voltage measurement and the three phase current measurements for the line segment. The controller then operates the sectionalizing switch in response to the determined directionality of the fault.

To isolate the fault, the directional fault controller identifies a faulted phase of the line segment, and determines directionality of the high impedance fault on the faulted phase. To identify the faulted phase, the controller computes positive, negative and zero sequence current components for each phase based on the three phase current measurements. The controller then identifies the faulted phase as having a phase angle between the negative sequence component and the zero sequence component less than a fault threshold value (e.g., 60 degrees).

The directional fault controller also determines the direction of the high impedance fault on the faulted phase. To determine the directionality of the fault, the controller determines a voltage phase angle for the faulted phase based on the single phase voltage measurement. The controller also determines a current lag phase angle between the zero sequence current for the faulted phase and the voltage for the faulted phase. The controller then determines that the fault is in a forward direction if the current lag phase angle is less than a direction threshold value (e.g., 90 degrees), and determines that the fault is in a reverse direction if the current lag phase angle is less than the direction threshold value. In addition, the directional fault controller may synthesize the voltage phase angle for the faulted phase angle to be 120 degrees out of phase from the phase angle of the measured voltage.

The directional fault sectionalizing system may also be employed for any combination of sectionalizing switches, such as a sectionalizing system for a three-way tap point on a three phase electric power circuit. The circuit includes a first line segment located in a forward direction from the tap point, a second line segment located in a reverse direction from the tap point, and a tapped line segment electrically connected to the first and second line segments through the tap point. The sectionalizing system includes a first sectionalizing switch electrically connected between the tap point and the first line segment. A second sectionalizing switch is electrically connected between the tap point and the second line segment. A voltage measuring device produces a measurement of a single phase voltage at or near the tap point. In addition, a first current measuring device produces three phase current measurements for the first line segment, and a second current measuring device produces three phase current measurements for the second line segment.

The directional fault controller operates a selected sectionalizing switch in response to a fault detected on one phase of the three phase electric power circuit. More specifically, the controller identifies a faulted phase and determines a first direction of the fault occurring on the faulted phase at the first current measuring device. The controller also determines second direction of the fault on the faulted phase at the second current measuring device. The controller then identifies a faulted line segment based on the first and second fault direction determinations, and operates one or both of the first and second sectionalizing switches to isolate the tap point from the faulted line segment.

To identify the direction of the fault, the controller determines that the first line segment is the faulted segment when the direction of the fault at the first current measuring device is forward and the direction of the fault at the second current measuring device is forward. The controller may then operate the first sectionalizing switch to isolate the tap point from the faulted first line segment (unless it is determined that the fault has occurred beyond the next sectionalizing switch in the forward direction, which may be determined by a similar directional fault sectionalizing system located at the next sectionalizing switch in the forward direction). Similarly, the controller determines that the second line segment is the faulted segment when the direction of the fault at the first current measuring device is reverse and the direction of the fault at the second current measuring device is reverse. The controller may then operate the second sectionalizing switch to isolate the tap point from the faulted second line segment (unless it is determined that the fault has occurred beyond the next sectionalizing switch in the reverse direction, which may be determined by a similar directional fault sectionalizing system located at the next sectionalizing switch in the reverse direction).

The controller may also determine that the tapped line segment is the faulted segment when the direction of the fault at the first current measuring device is reverse and the direction of the fault at the second current measuring device is forward. In this case, the controller operates the first and second sectionalizing switches to isolate the tapped line segment from the power line. Alternatively, if the sectionalizing system includes a third sectionalizing switch electrically connected between the tap point and the tapped line segment, the controller operates the third sectionalizing switches to isolate the tapped line segment from the power line.

In view of the foregoing, it will be appreciated that the present invention provides an improved directional fault sectionalizing system for a three phase electric power circuit. The specific structures and techniques for accomplishing the advantages described above will become apparent from the following detailed description of the embodiments and the appended drawings and claims.

DETAILED DESCRIPTION OF THE EMBODIMENTS

The present invention may be embodied in a directional fault sectionalizing system that utilizes a single phase voltage measurement and three simultaneous phase current measurements to determine the direction of a high impedance fault occurring on a single phase of a three phase electric power circuit. While the invention is not adapted to determine the directionality of multi-phase faults, the great majority of faults on transmission and distribution circuits are of the single-phase variety. As a result, the ability to increase the precision of fault isolation for single-phase faults captures the great majority of the benefit that can be achieved through directional fault detection. The directional fault sectionalizing system is particularly useful for commonly used three-way tap points along transmission and distribution lines where three phase voltage measurement is not readily available. The system is also capable of identifying high impedance faults under challenging circumstances, such faults occurring on unbalanced three phase power lines and faults occurring on tapped line segments where the currents are relatively small compared to the currents flowing in the main power line.

The key technological advance is the ability to determine the directionality of a high impedance fault at a three phase monitoring point using one phase voltage measurement and three phase current measurements. Once the capability to determine the fault directionality at any particular monitoring point has been developed, this capability can be expanded to create a directional fault sectionalizing system for more complex circuit configurations. For example, a directional fault sectionalizing system can be constructed for a three-way tap point that includes a sectionalizing switch and associated monitoring point on each of the main line segments serving the tap point. In particular, the directional fault sectionalizing system for a three-way tap point typically controls two sectionalizing switches (i.e., forward and reverse switches) through the use of a single phase voltage measurement and a pair of three-phase current measuring devices ("CMDs"), a first CMD located on the forward line segment and a second CMD located on the reverse line segment.

The directional fault controller determines the directionality of the high impedance fault at a particular monitoring point using a single phase voltage measurement and three phase current measurements through phasor analysis. These measurements are obtained for the same instant in time, which allows the directional fault controller to employ phasor analysis to determine the directionality of the fault. A first element of the directional fault analysis is phase voltage synthesis. The phase angles for the unmeasured phase voltages are synthesized by designating them to be 120 degrees out of phase with the measured phase voltage. The designated phase voltage angles are assigned to the correct phases by minimizing the phase angles between the current and voltage for each phase. This technique synthesizes the phase voltage angles for the unmeasured phases with sufficient accuracy for the purpose of determining the directionality of the fault.

A second element of the directional fault analysis is faulted phase identification. The directional fault controller identifies the faulted phase by computing the positive, negative and zero sequence current components for each phase from the phase current measurements. The faulted phase is then identified as the phase where the difference between the phase angles of the negative and zero sequence currents drops below a fault threshold value, which is typically set to 60 degrees. On an un-faulted phase, the difference between the phase angles of the negative and zero sequence currents is near 90 degrees, while the phase angle difference tends to collapse toward zero on a faulted line with higher resistance faults resulting in higher post-fault phase angle differences. As a result, a fault threshold value in the range of 60 degrees is considered appropriate for detecting a fault on a particular phase.

Once the faulted phase has been identified, single-phase fault direction analysis is used to determine the directionality of the fault on the faulted phase. More specifically, the current lag between the current and the voltage for the faulted phase is determined. A forward direction fault is indicated by a current lag less than a direction threshold value, whereas a reverse direction fault is indicated by a current lag greater than the direction threshold value. The current lag for a fault in the forward direction is always somewhat less than 90 degrees and tends toward zero degrees as the resistance of the fault increases. A direction threshold of 90 degrees is therefore considered appropriate for detecting a forward direction fault (i.e., the fault is determined to be in the forward direction fault when the current lag is less than 90 degrees). In addition, the current lag for fault in the reverse direction is always somewhat less than 270 degrees, and tends toward 180 degrees as the resistance of the fault increases. A direction threshold of 90 degrees is therefore also considered appropriate for detecting a reverse direction fault (i.e., the fault is determined to be in the reverse direction fault when the current lag is greater than 90 degrees).

Once the capability to determine the fault directionality at any particular monitoring point has been developed, this capability can be expanded to create a directional fault sectionalizing system for more complex circuit configurations. For a three-way tap point, for example, two sectionalizing switches are employed, a first sectionalizing switch on line section 1 (forward line segment), a second sectionalizing switch on line section 2 (reverse line segment). In addition, one phase voltage measuring device and two CMDs are employed, a first CMD on segment 1 and a second CMD on segment 2. A directional fault controller determines the direction of the fault at the first CMD (on the forward line segment) using the single phase voltage measurement and the three phase current measurements from the first CMD. The directional fault controller also determines the direction of the fault at the second CMD (on the reverse line segment) using the single phase voltage measurement and the three phase current measurements from the second CMD.

These two fault direction determinations are typically sufficient to operate the sectionalizing switches. Specifically, if the direction of the fault is in the forward direction at both CMDs, the first sectionalizing switch on segment 1 (forward line segment) is opened unless it can be determined that the fault has occurred beyond of the next sectionalizing switch in the forward direction, which may be determined by a similar directional fault sectionalizing system located at the next sectionalizing switch in the forward direction. Similarly, if the direction of the fault is in the reverse direction at both CMDs, the second sectionalizing switch on segment 2 (reverse line segment) is opened unless it can be determined that the fault has occurred beyond of the next sectionalizing switch in the reverse direction, which may be determined by a similar directional fault sectionalizing system located at the next sectionalizing switch in the forward direction. In addition, when the direction of the fault is in the reverse direction at the first CMD and in the forward direction at the second CMD (i.e., the direction of the fault is toward the tap from both directions), this indicates that the fault has occurred on the tapped line segment. In this case, both the first and second sectionalizing switches are opened to isolate the tap point from the power line. In a loop fed power line, the remainder of the power line remains in service with the opened sectionalizing switches isolating the fault on the tapped line segment from the power line.

As the current on the tapped line segment can be derived as the difference between the currents on the segments 1 and 2, a third CMD is not required for the tapped line segment. But in some cases, a third sectionalizing switch may be located on the tapped line segment to maintain loop-fed electric service when a tapped line section is isolated from the circuit. In this case, the directional fault sectionalizing system opens the third sectionalizing switch to isolate the tapped line segment from the power line when a fault occurs on the tapped line segment. This allows the remainder of the power line to remain in service when a fault occurring on the tapped segment is isolated from the power line.

In some cases, a fault can be falsely detected under difficult fault detection conditions, such as an unbalanced load, a high impedance fault, and when the fault occurs on the tapped line segment where the current is relatively small compared to the currents flowing in the main line segments. As an additional safeguard to avoid a false fault detection, an additional fault detection analysis can be performed for the tapped line segment. In this case, the phasor analysis described above is applied to the difference between the segment 1 and segment 2 line currents before and during the fault (i.e., the differential current, before and during the fault, on the tapped line segment). That is, the positive, negative and zero sequence currents on each phase are computed for the differential current. The phase angle difference between the negative and zero sequence currents is then computed for the differential current for each phase. A fault is detected on a particular phase if the phase angle difference between the negative and zero sequence currents has collapsed below the fault threshold value (e.g., 60 degrees) on that phase. Typically, the fault detected with the differential current analysis will be on the same phase determined during the original fault detection analysis using the full line currents, providing verification of the fault and the faulted phase.

U.S. Pat. No. 8,659,862 entitled "Directional Fault Location and Isolation System" describes in greater detail how multiple directional fault monitoring points are operated in a coordinated manner to implement a sectionalizing system for an electric power line with multiple tap points and the CMDs are described in commonly owned U.S. Pat. Nos. 7,191,074 and 7,683,798, which are incorporated by reference. The following description explains how fault directionality is determined and the sectionalizing system is operated at each tap point.

Figure 1A:
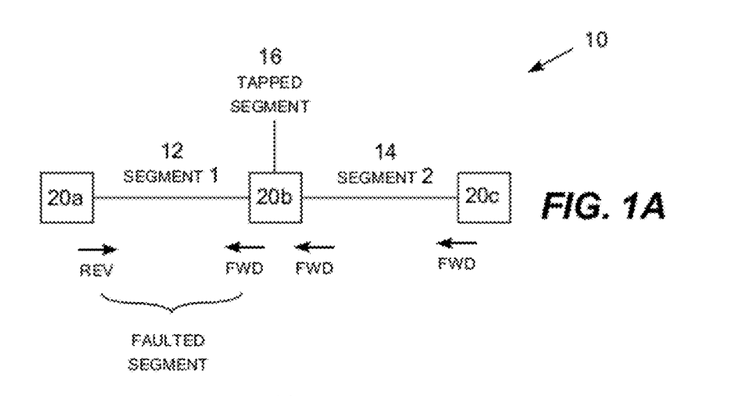
FIG. 1A is a schematic diagram illustrating fault detection on a forward line segment in a three phase electric power circuit.
Figure 1B:
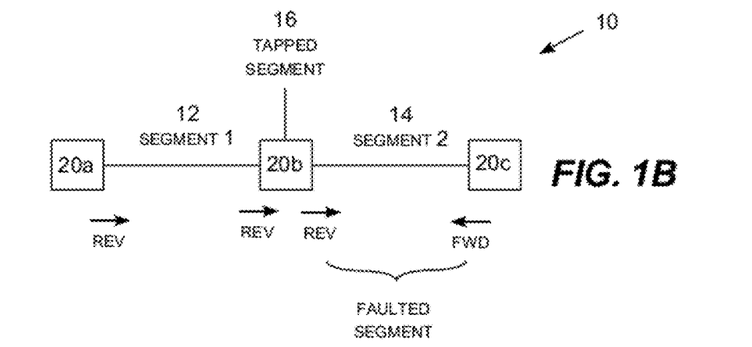
FIG. 1B is a schematic diagram illustrating fault detection on a reverse line segment in a three phase electric power circuit.
Figure 1C:
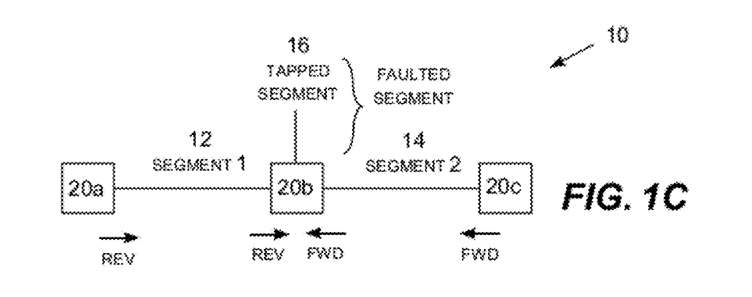
FIG. 1C is a schematic diagram illustrating fault detection on a tapped line segment in a three phase electric power circuit.

Turning now to the figures, FIGS. 1A-C are schematic diagrams illustrating fault detection on a three phase electric power circuit 10. The electric power circuit includes a forward line segment 1 (element 12), a reverse forward line segment 2 (element 14), and a tapped line segment 16. A first directional fault sectionalizing system 20a is located in the forward direction from segment 1, second directional fault sectionalizing system 20b is located at a tap point connecting segment 1, segment 2, and the tapped line segment, and third directional fault sectionalizing system 20c is located in the reverse direction from segment 2. The ability to determine the direction of the fault from each directional fault controller allows the faulted line segment to be identified.

More specifically, segment 1 is identified as the faulted segment when the fault is determined to be in the reverse direction from the first sectionalizing system 20a and in the forward direction from the second sectionalizing system 20b, as shown in FIG. 1A. Similarly, segment 2 is identified as the faulted segment when the fault is determined to be in the reverse direction from the second sectionalizing system 20b and in the forward direction from the third sectionalizing system 20c. In addition, the tapped line segment is identified as the faulted segment when the fault is determined to be in the reverse direction from segment 1 and in the forward direction from segment 2 at the second sectionalizing system 20b (i.e., the fault is toward tap point at 20b from both directions), as shown in FIG. 1C. FIGS. 1A-C merely illustrate a representative portion of the overall sectionalizing system. The overall sectionalizing system includes similar directional fault sectionalizing systems at additional monitoring points (typically tap points) in the forward and reverse direction and on other power lines throughout the network. All of the sectionalizing switches as preferably monitored and operated in a coordinated manner from a central control station to correctly identify and sectionalize line sections experiencing faults throughout the network.

Figure 2:
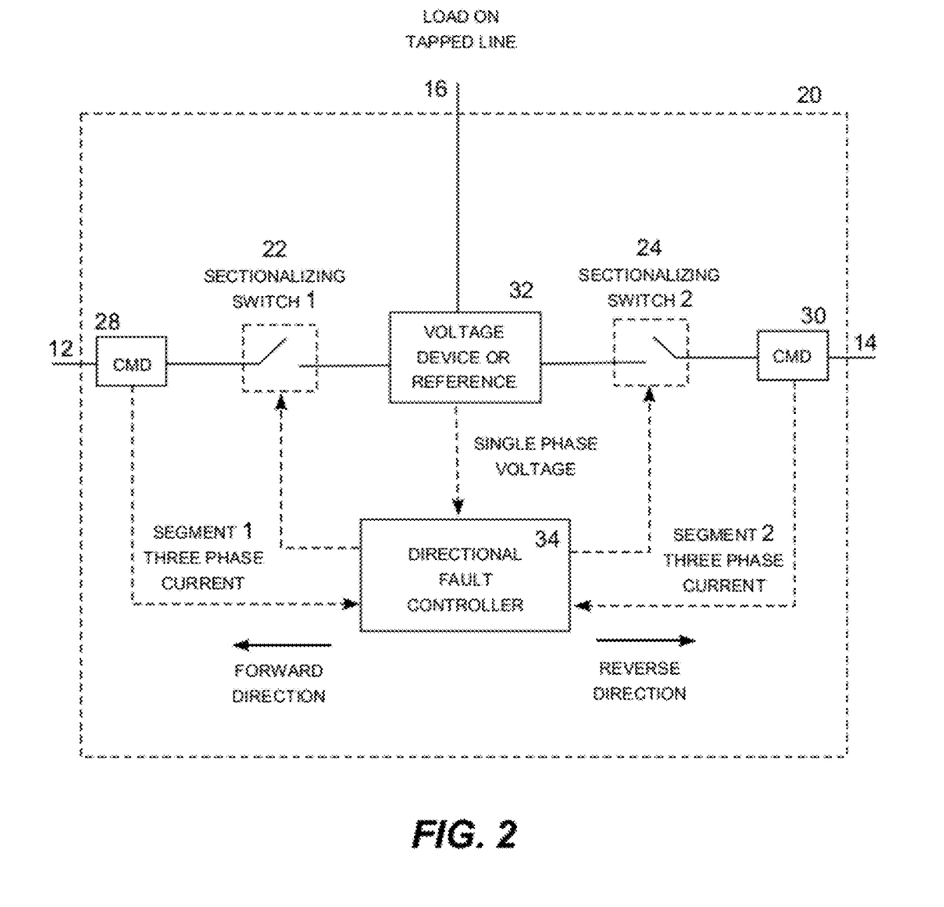
FIG. 2 is a schematic diagram of a directional fault sectionalizing system for a three phase electric power circuit.
Figure 3:
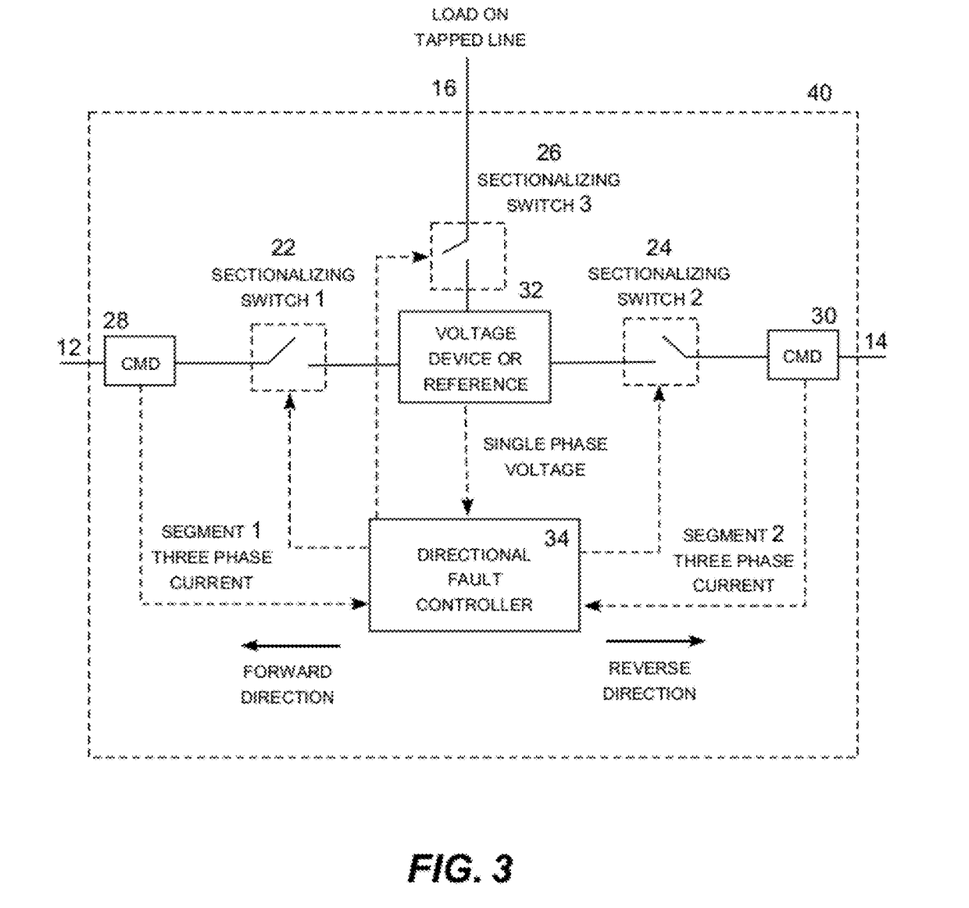
FIG. 3 is a schematic diagram of an alternative directional fault sectionalizing system for a three phase electric power circuit.

It should be noted that each directional fault sectionalizing system typically includes two monitoring points (CMDs), one on each power line side of the tap point allowing the controller to operate the sectionalizing system for a three-way tap point, as shown in FIGS. 2 and 3. In other words, each sectionalizing system typically has the capability to determine the direction of the fault on both the forward and reverse line segments at each tap point. Implementing this type of directional fault sectionalizing system at each tap point allows for cost effective directional fault identification and isolation throughout the transmission and distribution system.

FIG. 2 is a schematic diagram of an illustrative directional fault sectionalizing system 20 for a three phase electric power circuit, which can generally be used for each sectionalizing system 20a-c shown in FIGS. 1A-C. The three-phase power circuit includes a forward line segment 1 (element 12), a reverse forward line segment 2 (element 14), and a tapped line segment 16. The sectionalizing system 20 includes a first sectionalizing switch 22 located on the forward line segment (segment 1) and a second sectionalizing switch 24 located on the reverse line segment (segment 2). A first CMD 28 located on the forward line segment (segment 1) produces three phase current measurement for line segment 1. A second three-phase CMD 30 located on the reverse line segment (segment 2) produces three phase current measurements for line segment 2. Illustrative CMDs are described in commonly owned U.S. Pat. Nos. 7,191,074 and 7,683,798, which are incorporated by reference.

A voltage device or reference 32, which in some cases may be part of the existing power circuit or it may be added as part of the sectionalizing system 20, provides a single-phase voltage measurement at or near the tap point. A directional fault controller 34 receives the single phase voltage measurement, the three phase current measurements for line segment 1, and the three phase current measurements for line segment 2. The controller uses this information to determine the directionality of the fault at each monitoring point (CMD 28 and 30) and operate the first sectionalizing switch, the second sectionalizing switch, or both sectionalizing switches to isolate the tap point from a faulted line segment. In general, the controller opens the first sectionalizing switch 22 when a fault is determined to be located in the forward direction from the first CMD 28 (segment 1) unless it has been determined that the fault has occurred further in the forward direction from the next sectionalizing switch in the forward direction. Similarly, the controller opens the second sectionalizing switch 24 when a fault is determined to be located in the reverse direction from the second CMD 30 (segment 2) unless it has been determined that the fault has occurred further in the reverse from the next sectionalizing switch in the reverse direction. In addition, the controller opens both sectionalizing switches 22, 24 when it determines that the fault has occurred on the tapped line segment 16. This is appropriate for loop fed power lines where the tapped line can be isolated by opening both sectionalizing switches while the remainder of the power remains energized.

FIG. 3 illustrates an alternative sectionalizing system 40 that is suitable for a radial or loop fed transmission or distribution line. The only difference between the sectionalizing system 20 shown in FIG. 2 and the sectionalizing system 40 is the presence of a third sectionalizing switch 26 on the tapped line segment 16. The third sectionalizing switch is opened to isolate a fault occurring on the tapped line segment. This allows the tapped line segment to be isolated while the remainder of the power line remains in service (i.e., switch 26 is opened while switches 22 and 24 remain closed). In either case shown in FIG. 2 or 3, the sectionalizing switches are operated, as appropriate, in response to the fault directionality determination by the directional fault controller 34, which determines the direction of the fault at each current monitoring point with three phase current measurements a single phase voltage measurement.

Figure 4A:
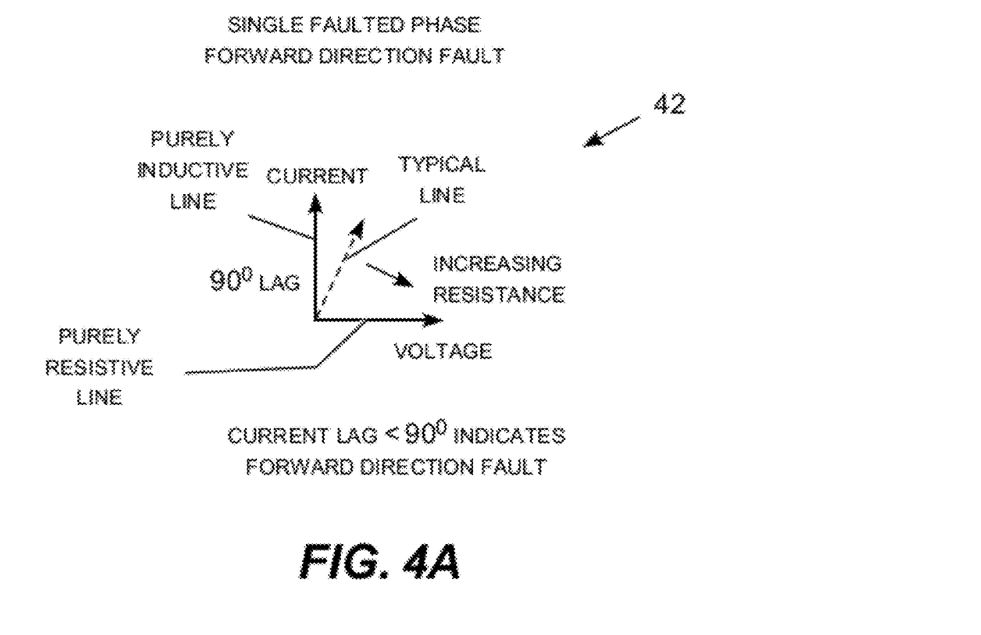
FIG. 4A is a graph illustrating forward fault detection for a faulted phase of a three phase electric power circuit.
Figure 4B:
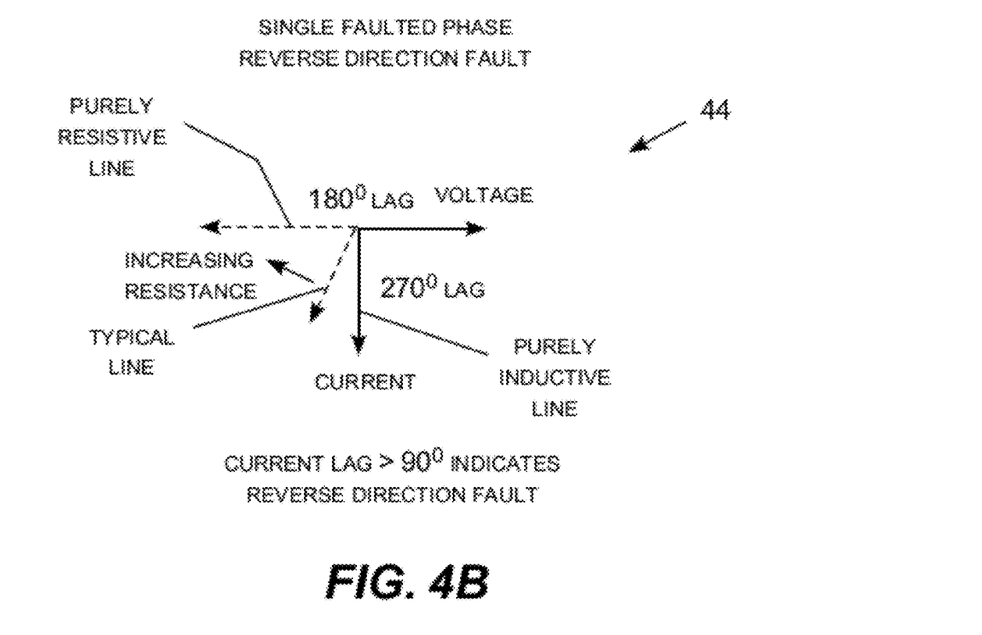
FIG. 4B is a graph illustrating reverse fault detection for a faulted phase of a three phase electric power circuit.

FIGS. 4A and 4B show graphs 42 and 44 illustrating directional fault detection for a faulted phase of a three phase electric power circuit. Once the faulted phase has been identified, the direction of the fault on the faulted phase can be accomplished through single phase fault analysis, as shown in FIGS. 4A-B. Referring to FIG. 4A, when the fault occurs in the forward direction, the current lags the voltage by an amount in the range of 0 degrees to 90 degrees, where the current lag is 90 degrees for a purely inductive load, 0 degrees for a purely resistive load, and generally tends from the 90 degree inductive limit toward the 0 degree resistive limit as the resistance of the faulted load increases. As a result, the fault can be determined to be in the forward direction when the current lags the voltage by less than 90 degrees, which can be used as a forward direction threshold value. For the single-phase fault on a three-phase circuit, the zero sequence current component is typically used in the preceding analysis because the unbalanced, higher current occurring on the faulted phase appears in the zero sequence current component.

Referring now to FIG. 4B, when the fault occurs in the reverse direction, the current lags the voltage by an amount in the range of 180 degrees to 270 degrees, where the current lag is 270 degrees for a purely inductive load, 180 degrees for a purely resistive load, and generally tends from the 270 degree inductive limit toward the 180 degree resistive limit as the resistance of the faulted load increases. As a result, the fault can be determined to be in the reverse direction when the current lags the voltage by less than any threshold at or below about 180 degrees. Since 90 degrees is well less than 180 degrees, 90 degrees can be also used as the direction threshold value reverse direction detection. As a result, a current lag less than a direction threshold value of 90 degrees can be used to indicate a fault in the forward direction, while a current lag greater than the same direction threshold value of 90 degrees can be used to indicate a fault in the reverse direction.

Figure 5:
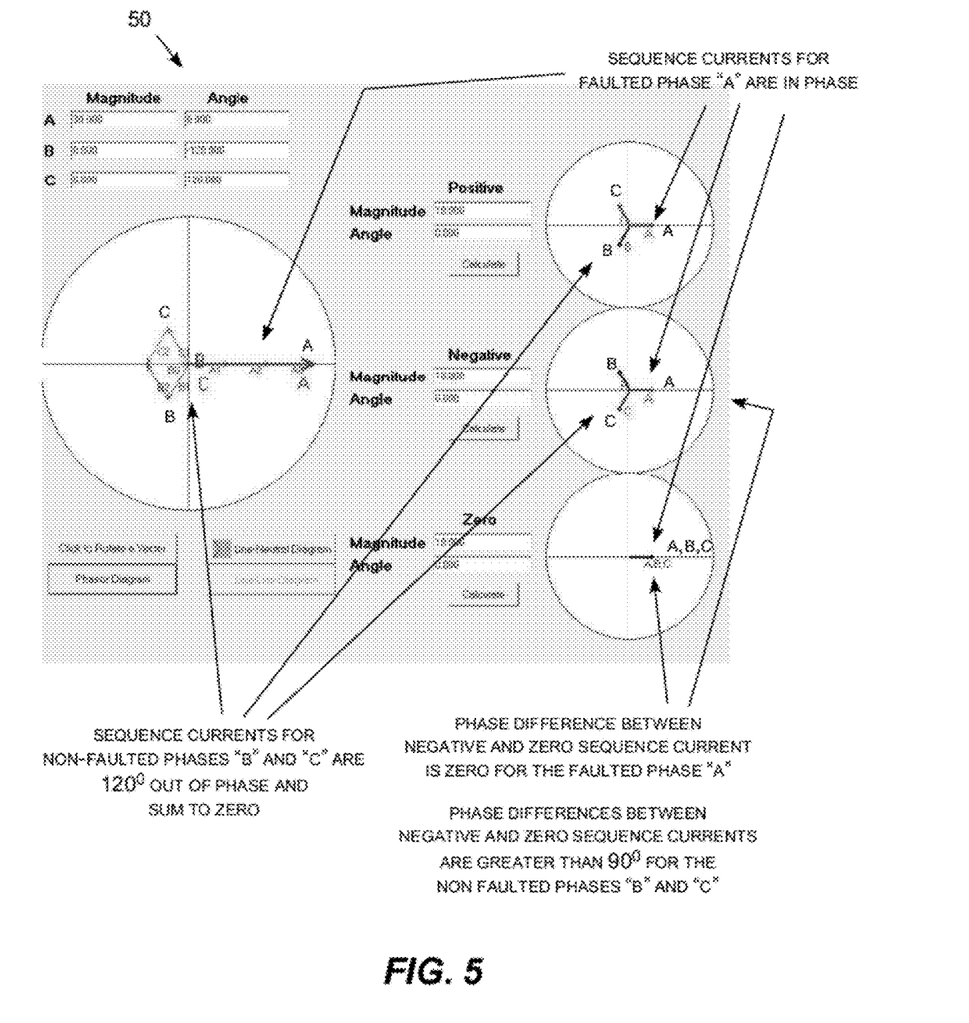
FIG. 5 is a set of phasor diagrams illustrating faulted phase identification.

FIG. 5 is a set of phasor diagrams 50 illustrating faulted phase identification. The faulted phase is identified by decomposing the phase currents into their positive, negative and zero sequence current components, which are each represented as a phasor having magnitude and phase angle components. The upper right phasor diagram shows the positive sequence components for the phase currents. This diagram shows that the positive sequence components are relatively balanced and 120 degrees out of phase with each other. The middle right phasor diagram shows the negative sequence components for the phase currents. Again, this diagram shows that the negative sequence components are relatively balanced and 120 degrees out of phase with each other. In addition, the positive and negative sequence component for phase "B" are 120 degrees out of phase, and the positive and negative sequence component for phase "C" are 120 degrees out of phase, whereas the positive and negative sequence component for phase "A" are in phase with each other indicating that phase "A" is the faulted phase.

The bottom right phasor diagram shows the zero sequence components for the phase currents. This diagram shows that the zero sequence components for all three phases are in phase with each other. The zero sequence components are also in phase with the positive and negative sequence component for phase "A." That is, the phase angle between the negative and zero sequence components is about 120 degrees for phase "B" and phase "C" but has collapsed to near zero for phase "A" indicating that the fault has occurred on phase "A." This is further illustrated on the composite phasor diagram on the left portion of FIG. 5. Here it is shown that the positive, negative and zero sequence components for phases "B" and C" sum to zero, whereas the positive, negative and zero sequence components for phase "A" are in phase and add together rather than canceling out, again indicating that the fault has occurred on phase "A."

While FIG. 5 illustrates the theoretical case of a zero impedance fault, the phase angle difference between the negative and zero sequence components will generally remain near 120 degrees for the un-faulted phases and collapse to a noticeable extent for the faulted phase. A fault threshold value in the range of 60 degrees is deemed appropriate for detecting the faulted phase. In other words, a faulted phase is detected when the phase angle difference between the negative and zero sequence components falls below a fault threshold value in the range of 60 degrees.

Figure 6:
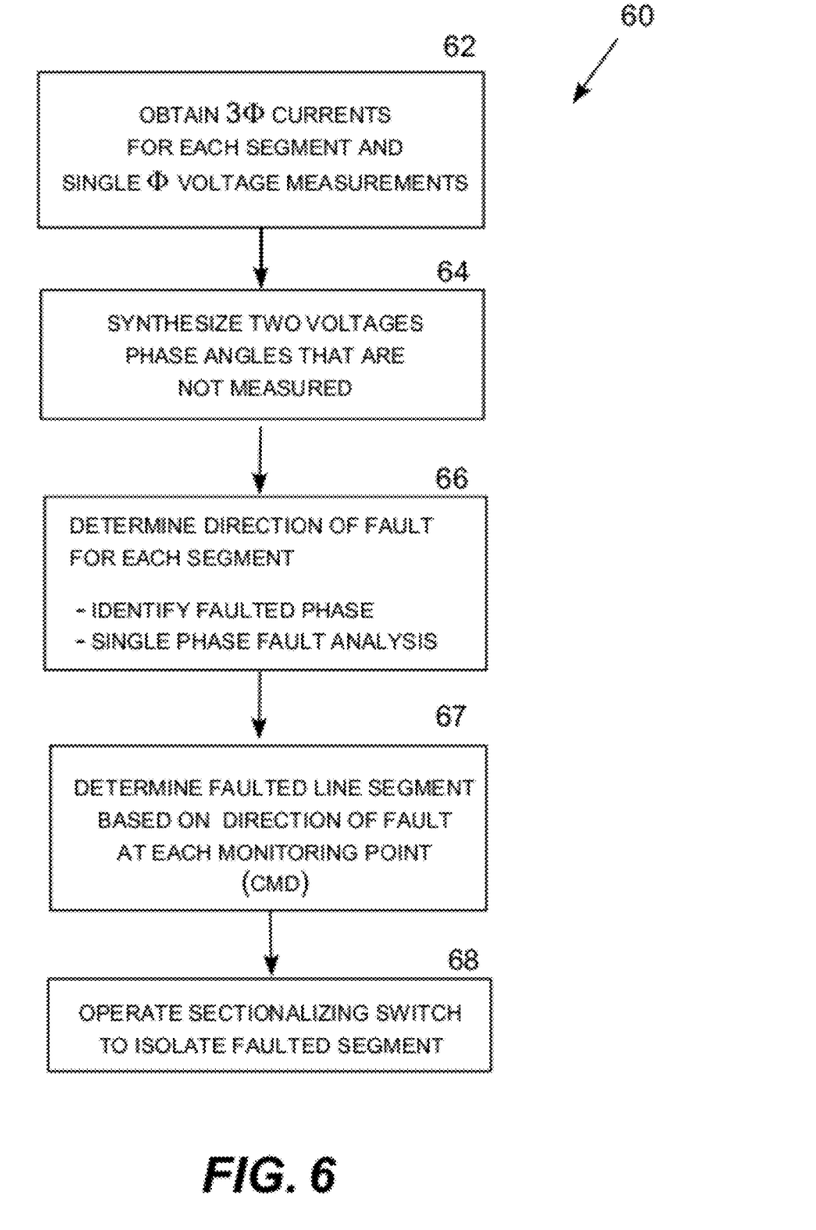
FIG. 6 is a logic flow diagram illustrating a routine for operating a directional fault sectionalizing system for a three phase electric power circuit.

FIG. 6 is a logic flow diagram illustrating a routine 60 for directional fault sectionalizing system for a three phase electric power circuit, which is typically implemented by the directional fault controller 34 shown in FIGS. 2 and 3. In step 62, the controller obtains three phase current measurements for each line segment (e.g., the three phase currents in segments 1 and 2 provided by the CMDs 28 and 30 shown in FIGS. 2 and 3) and a single phase voltage measurement (e.g., the single phase voltage measurement provided by the voltage device or reference 32 shown in FIGS. 2 and 3). Step 62 is followed by step 64, in which the controller synthesizes the voltage phase angled for the unmeasured phase voltages (e.g., designating the unmeasured phase voltages to be 120 degrees out of phase with the measured phase voltage and assigned to the phase minimizing the current lag). Step 64 is followed by step 66, in which the controller determines the direction of the fault by identifying the faulted phase and then determining the direction of the fault on the faulted phase. Step 66 is further described with reference to FIG. 7. Step 66 is followed by step 67, in which the controller identifies a faulted line segment based on the determined direction of the fault at each monitoring point (CMD). Step 67 is followed by step 68, in which the controller operates one or more selected sectionalizing switches to isolate the faulted line segment as described previously with reference to FIGS. 1A-C, 2 and 3.

Figure 7:
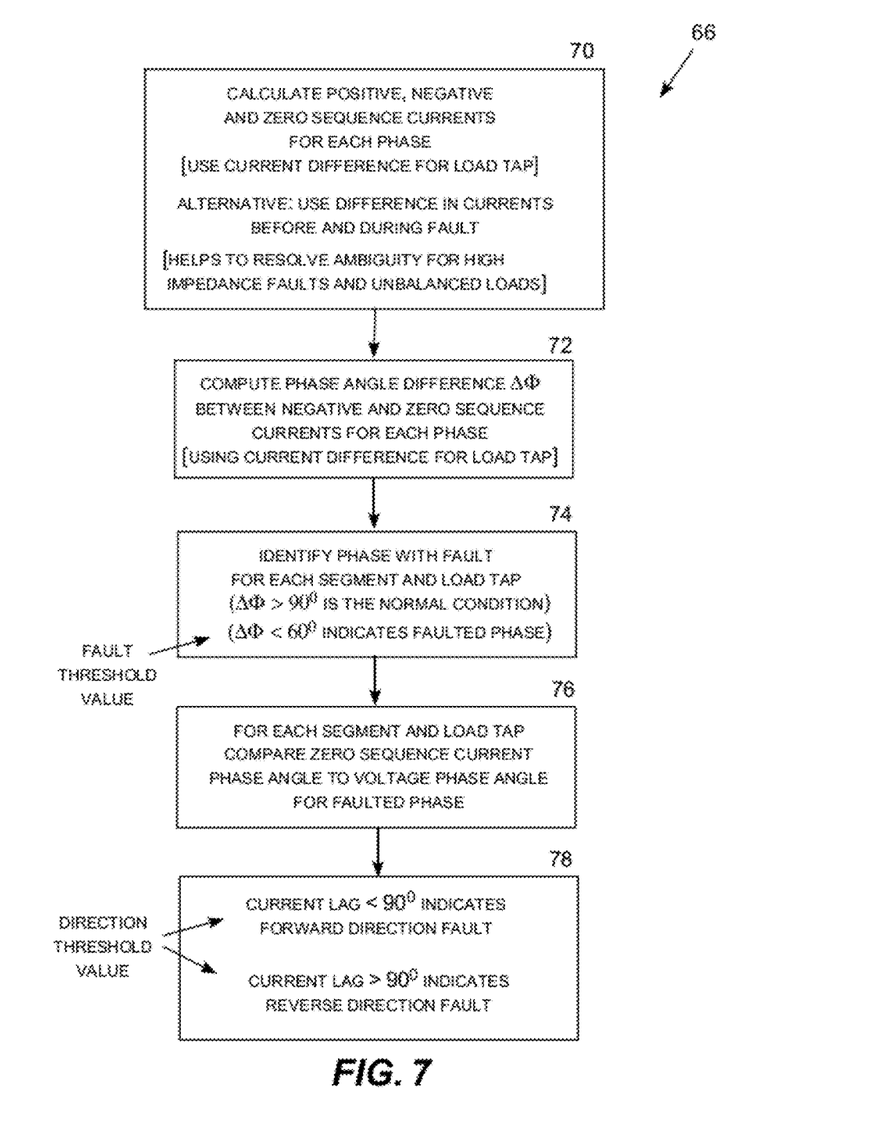
FIG. 7 is a logic flow diagram illustrating a routine for determining the direction of a fault in the directional fault sectionalizing system.

FIG. 7 is a logic flow diagram further illustrating step 66, in which the controller determines the direction of the fault by first identifying the faulted phase and then determining the direction of the fault on the faulted phase. In step 70, the controller calculates the positive, negative and zero sequence components for each phase current. Step 70 is followed by step 72, in which the controller computes the phase angle difference between the negative and zero sequence components for each phase. Step 72 is followed by step 74, in which the controller identifies the faulted phase as the phase in which the phase angle difference between the negative and zero sequence components has fallen below a fault threshold value, which can typically be set at 60 degrees. This procedure is shown pictorially through phasor diagrams and described further with reference to FIG. 5.

It should be noted that the controller typically computes the phase currents for the tapped line segment by using the differences in the phase currents on the forward line segment (segment 1) and the reverse line segment (segment 2) to derive the phase currents for the tapped line segment. The controller should identify the same phase as the faulted phase on line segments 1 and 2, as well as the tapped line, to provide verification that the faulted phase has been correctly identified.

Once the faulted phase has been identified, step 74 is followed by steps 76 and 78, in which the controller determines the direction of the fault on the faulted phase. In step 74, the zero sequence current phase angle is compared to the voltage phase angle for the faulted phase to determine the current lag for the faulted phase. In step 78, the fault is determined to be in the forward direction when the current lag is less than a direction threshold value, and the fault is determined to be in the reverse direction when the current lag is greater than the direction threshold value. For example, the direction threshold value may be set to 90 degrees as described in greater detail with reference to FIGS. 4A-B.

The fault phase identification procedure described above can be further verified by repeating the procedure described above using the differential current on the tapped line segment before and after the fault, where the current on the tapped line is derived as the difference between the measured currents on the power line segments 1 and 2 measured with the CMDs as shown in FIGS. 2 and 3. In step 70, the controller computes the positive, negative and zero sequence components for the differential phase currents. Step 70 is followed by step 72, in which the controller computes the phase angle difference between the negative and zero sequence components for each phase of the differential current. Step 72 is followed by step 74, in which the controller identifies the faulted phase as the phase in which the phase angle difference between the negative and zero sequence components of the differential current has fallen below the fault threshold value. The existence of the fault and the identification of the faulted phase is confirmed when the full line current analysis and the differential current analysis both detect the fault and identify the same phase as the faulted phase. The differential current analysis is helpful to resolve any ambiguity that might occur under difficult fault analysis conditions, such as imbalanced loads, high impedance faults, and faults occurring on the tapped line where the currents are much lower than the power line currents, without requiring a third CMD on the tapped line section.

Those skilled in the art will appreciate that the foregoing describes preferred embodiments of the invention and that many adjustments and alterations will be apparent to those skilled in the art within the spirit and scope of the invention as defined by the appended claims.

The invention claimed is:

1. A directional fault sectionalizing system for a three phase electric power line segment, comprising:
    a sectionalizing switch operatively connected to the line segment;
    a voltage measuring device producing a measurement of a single phase voltage for the line segment;
    a current measuring device producing three simultaneous phase current measurements for the line segment; and
    a directional fault controller operative to:
        determine directionality of a high impedance fault occurring on one phase of the line segment based on the single phase voltage measurement and the three phase current measurements for the line segment,
        operate the sectionalizing switch in response to the determined directionality of the fault,
        compute positive, negative and zero sequence current components for each phase based on the three phase current measurements, and
        identify the faulted phase as having a phase angle between the negative sequence component and the zero sequence component less than a fault threshold value.

2. The directional fault sectionalizing system of claim 1, wherein the directional fault controller is further operative to:
    identify a faulted phase of the line segment; and
    determine directionality of the fault on the faulted phase.

3. The directional fault sectionalizing system of claim 1, wherein the directional fault controller is further operative to:
    determine a voltage phase angle for the faulted phase based on the single phase voltage measurement;
    determine a current lag phase angle between the zero sequence current component for the faulted phase and the voltage for the faulted phase;
    determine that the fault is in a forward direction if the current lag phase angle is less than a direction threshold value; and
    determine that the fault is in a reverse direction if the current lag phase angle is less than the direction threshold value.

4. The directional fault sectionalizing system of claim 3, wherein the directional fault controller is operative to determine the voltage phase angle for the faulted phase by synthesizing the voltage phase angle for the faulted phase angle to be 120 degrees out of phase from the phase angle of the measured voltage.

5. A directional fault sectionalizing system for a three phase electric power circuit having a tap point, a first line segment located in a forward direction from the tap point, a second line segment located in a reverse direction from the tap point, and a tapped line segment electrically connected to the first and second line segments through the tap point, comprising:
    a first sectionalizing switch electrically connected between the tap point and the first line segment;
    a second sectionalizing switch electrically connected between the tap point and the second line segment;
    a voltage measuring device producing a measurement of a single phase voltage at or near the tap point;
    a first current measuring device producing three simultaneous phase current measurements for the first line segment;
    a second current measuring device producing three simultaneous phase current measurements for the second line segment; and
    a directional fault controller operative to operate a selected sectionalizing switch in response to a high impedance fault detected on one phase of the three phase electric power circuit, the directional fault controller further operative to:
        determine a first direction of the high impedance fault occurring at the first current measuring device,
        determine a second direction of the high impedance fault at the second current measuring device,
        identify a faulted line segment based on the first and second fault direction determinations, and
        operate one or both of the first and second sectionalizing switches to isolate the tap point from the faulted line segment.

6. The directional fault sectionalizing system of claim 5, wherein the directional fault controller is further operative to:
    identify a faulted phase of the line segment;
    determine a first direction of the fault on the faulted phase at the first current measuring device; and
    determine a second direction of the fault on the faulted phase at the second current measuring device.

7. The directional fault sectionalizing system of claim 6, wherein the directional fault controller is further operative to:
   determine that the first line segment is the faulted segment when the direction of the fault at the first current measuring device is forward and the direction of the fault at the second current measuring device is forward;
   operate the first sectionalizing switch in response to determining that the first line segment is the faulted line segment;
   determine that the second line segment is the faulted segment when the direction of the fault at the first current measuring device is reverse and the direction of the fault at the second current measuring device is reverse;
   operate the second sectionalizing switch in response to determining that the second line segment is the faulted line segment;
   determine that the tapped line segment is the faulted segment when the direction of the fault at the first current measuring device is reverse and the direction of the fault at the second current measuring device is forward; and
   operate the first and second sectionalizing switches, or a third sectionalizing switch electrically connected between the tap point and the tapped line segment, in response to determining that the tapped line segment is the faulted line segment.

8. The directional fault sectionalizing system of claim 6, wherein the directional fault controller is further operative to:
   compute positive, negative and zero sequence current components for each phase of the three phase circuit based on three phase current measurements; and
   identify the faulted phase as having a phase angle between the negative sequence component and the zero sequence component less than a fault threshold value.

9. The directional fault sectionalizing system of claim 6, wherein the directional fault controller is further operative to:
   determine a voltage phase angle for the faulted phase based on the single phase voltage measurement;
   compute positive, negative and zero sequence current components for each phase of the first line segment based on three phase current measurements for the first line segment;
   determine a first current lag phase angle between the zero sequence component for the faulted phase of the first line segment and the voltage for the faulted phase;
   determine that the fault is in a forward direction at the first current measuring device if the first current lag phase angle is less than a direction threshold value;
   determine that the fault is in a reverse direction at the first current measuring device if the first current lag phase angle is less than the direction threshold value;
   compute positive, negative and zero sequence current components for each phase of the second line segment based on three phase current measurements for the second line segment;
   determine a second current lag phase angle between the zero sequence component for the faulted phase of the second line segment and the voltage for the faulted phase;
   determine that the fault is in a forward direction at the second current measuring device if the second current lag phase angle is less than the direction threshold value; and
   determine that the fault is in a reverse direction at the second current measuring device if the second current lag phase angle is less than the direction threshold value.

10. The directional fault sectionalizing system of claim 9, wherein the directional fault controller is further operative to determine the voltage phase angle for the faulted phase by synthesizing the voltage phase angle for the faulted phase angle to be 120 degrees out of phase from the phase angle of the measured voltage.

11. A method for operating a sectionalizing switch to isolate a high impedance fault occurring on one phase a three phase of electric power line segment having a voltage measuring device operative to provide a measurement of voltage on one phase of the line segment, comprising the steps of:
   locating a current measuring device on the line segment operative to produce three simultaneous phase current measurements for the line segment;
   connecting a directional fault controller to receive the single phase voltage measurement and the three phase current measurements for the line segment;
   connecting the directional fault controller to operate the sectionalizing switch; and
   configuring the directional fault controller to:
      determine directionality of the high impedance fault based on the single phase voltage measurement and the three phase current measurements for the line segment, and
      operate the sectionalizing switch in response to the determined directionality of the fault,
      compute positive, negative and zero sequence current components for each phase based on the three phase current measurements, and
      identify the faulted phase as having a phase angle between the negative sequence component and the zero sequence component less than a fault threshold value.

12. The method of claim 11, further comprising the step of configuring the directional fault detector to:
   identify a faulted phase of the line segment; and
   determine directionality of the fault on the faulted phase.

13. The method of claim 11, further comprising the step of configuring the directional fault detector to:
   determine a voltage phase angle for the faulted phase based on the single phase voltage measurement;
   determine a current lag phase angle between the zero sequence current for the faulted phase and the voltage for the faulted phase;
   determine that the fault is in a forward direction if the current lag phase angle is less than a direction threshold value; and
   determine that the fault is in a reverse direction if the current lag phase angle is less than the direction threshold value.

14. The method of claim 11, wherein the line segment is a first line segment located in a forward direction from a tap point, the current measuring device is a first current measuring device operative to produce three phase current measurements for the first line segment, the sectionalizing switch is a first sectionalizing switch operatively connected between the first line segment and the tap point, wherein the first line segment forms part of an electric power circuit further comprising a second line segment located in a reverse direction from the tap point, a second sectionalizing switch operatively connected between the second line segment and the tap point, and a tapped line segment electrically connected to the first and second line segments through the tap point, further comprising the steps of:
   locating a second current measuring device on the second line segment operative to produce three phase current measurements for the second line segment;

connecting the directional fault controller to receive the three phase current measurements for the second line segment;

connecting the directional fault controller to operate the second sectionalizing switch; and configuring the directional fault controller to:
- determine a first direction of the fault occurring at the first current measuring device,
- determine a second direction of the fault at the second current measuring device,
- identify a faulted line segment based on the first and second fault direction determinations, and
- operate the second sectionalizing switch in response to determining that the second line segment is the faulted line segment.

15. The method of claim 14, further comprising the step of configuring the directional fault detector to:
- identify a faulted phase of the line segment;
- determine a first direction of the fault on the faulted phase at the first current measuring device;
- determine a second direction of the fault on the faulted phase at the second current measuring device;
- determine that the first line segment is the faulted segment when the direction of the fault at the first current measuring device is forward and the direction of the fault at the second current measuring device is forward;
- operate the first sectionalizing switch in response to determining that the first line segment is the faulted line segment;
- determine that the second line segment is the faulted segment when the direction of the fault at the first current measuring device is reverse and the direction of the fault at the second current measuring device is reverse;
- operate the second sectionalizing switch in response to determining that the second line segment is the faulted line segment;
- determine that the tapped line segment is the faulted segment when the direction of the fault at the first current measuring device is reverse and the direction of the fault at the second current measuring device is forward; and
- operate the first and second sectionalizing switches, or a third sectionalizing switch electrically connected between the tap point and the tapped line segment, in response to determining that the tapped line segment is the faulted line segment.

16. The directional fault sectionalizing system of claim 15, wherein the directional fault controller is further operative to:
- compute positive, negative and zero sequence current components for each phase of the three phase circuit based on three phase current measurements; and
- identify the faulted phase as having a phase angle between the negative sequence component and the zero sequence component less than a fault threshold value.

17. The directional fault sectionalizing system of claim 16, wherein the directional fault controller is further operative to:
- determine a voltage phase angle for the faulted phase based on the single phase voltage measurement;
- compute positive, negative and zero sequence current components for each phase of the first line segment based on three phase current measurements for the first line segment;
- determine a first current lag phase angle between the zero sequence component for the faulted phase of the first line segment and the voltage for the faulted phase;
- determine that the fault is in a forward direction at the first current measuring device if the first current lag phase angle is less than a direction threshold value;
- determine that the fault is in a reverse direction at the first current measuring device if the first current lag phase angle is less than the direction threshold value;
- compute positive, negative and zero sequence current components for each phase of the second line segment based on three phase current measurements for the second line segment;
- determine a second current lag phase angle between the zero sequence component for the faulted phase of the second line segment and the voltage for the faulted phase;
- determine that the fault is in a forward direction at the second current measuring device if the second current lag phase angle is less than the direction threshold value; and
- determine that the fault is in a reverse direction at the second current measuring device if the second current lag phase angle is less than the direction threshold value.

18. The method claim 17, wherein the directional fault controller is further operative to determine the voltage phase angle for the faulted phase by synthesizing the voltage phase angle for the faulted phase angle to be 120 degrees out of phase from the phase angle of the measured voltage.

* * * * *